US012799430B2

(12) United States Patent
Oie et al.

(10) Patent No.: US 12,799,430 B2
(45) Date of Patent: Nov. 17, 2026

(54) COMPOSITION FOR CLEANING SEMICONDUCTOR SUBSTRATE, METHOD FOR CLEANING SEMICONDUCTOR SUBSTRATE, AND METHOD FOR PRODUCING SEMICONDUCTOR SUBSTRATE

(71) Applicant: MITSUBISHI GAS CHEMICAL COMPANY, INC., Tokyo (JP)

(72) Inventors: Toshiyuki Oie, Taichung City (TW); Tomoyuki Adaniya, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 369 days.

(21) Appl. No.: 18/276,480

(22) PCT Filed: Feb. 4, 2022

(86) PCT No.: PCT/JP2022/004347
§ 371 (c)(1),
(2) Date: Aug. 9, 2023

(87) PCT Pub. No.: WO2022/172862
PCT Pub. Date: Aug. 18, 2022

(65) Prior Publication Data

US 2024/0117277 A1 Apr. 11, 2024

(30) Foreign Application Priority Data

Feb. 12, 2021 (JP) ................................ 2021-020738
Mar. 23, 2021 (JP) ................................ 2021-048719

(51) Int. Cl.
*C11D 1/62* (2006.01)
*C11D 3/00* (2006.01)
(Continued)

(52) U.S. Cl.
CPC ............ *C11D 3/245* (2013.01); *C11D 3/0073* (2013.01); *C11D 3/2075* (2013.01);
(Continued)

(58) Field of Classification Search
CPC ..... C11D 3/2075; C11D 3/2079; C11D 3/245; C11D 3/30; C11D 7/3209; C11D 3/3902
(Continued)

(56) References Cited

U.S. PATENT DOCUMENTS

2009/0093107 A1 4/2009 Lee et al.
2015/0027978 A1 1/2015 Barnes et al.
(Continued)

FOREIGN PATENT DOCUMENTS

EP 0827188 B1 * 9/2003 .......... H01L 21/304
JP 2009019255 A 1/2009
(Continued)

OTHER PUBLICATIONS

Extended European Search Report issued Dec. 4, 2024 in Patent Application No. 22752689.4, 9 pages.
(Continued)

*Primary Examiner* — Gregory R Delcotto
(74) *Attorney, Agent, or Firm* — Element IP, PLC

(57) ABSTRACT

Provided is a composition for cleaning semiconductor substrates, having high removal rate of tungsten oxide with high Ti/W etching selectivity.

The composition for cleaning semiconductor substrates, comprising an oxidizing agent (A), a fluorine compound (B), a metallic tungsten corrosion inhibiter (C), and a tungsten oxide etching accelerator (D), wherein the addition ratio of the oxidizing agent (A) is from 0.0001 to 10% by mass relative to the total mass of the composition for cleaning semiconductor substrates; the addition ratio of the fluorine compound (B) is from 0.005 to 10% by mass relative to the
(Continued)

total mass of the composition for cleaning semiconductor substrates; and the addition ratio of the metallic tungsten corrosion inhibiter (C) is from 0.0001 to 5% by mass relative to the total mass of the composition for cleaning semiconductor substrates.

5 Claims, 1 Drawing Sheet

(51) Int. Cl.

| | |
|---|---|
| ***C11D 3/20*** | (2006.01) |
| ***C11D 3/24*** | (2006.01) |
| ***C11D 3/30*** | (2006.01) |
| ***C11D 3/39*** | (2006.01) |
| ***C11D 3/395*** | (2006.01) |
| ***C11D 7/32*** | (2006.01) |
| *H10P 52/00* | (2026.01) |

(52) U.S. Cl.
CPC .............. *C11D 3/2079* (2013.01); *C11D 3/30* (2013.01); *C11D 3/3902* (2013.01); *C11D 7/3209* (2013.01); *C11D 2111/22* (2024.01); *H10P 52/00* (2026.01)

(58) Field of Classification Search
USPC ................ 510/175, 176, 477, 488, 499, 504
See application file for complete search history.

(56) References Cited

U.S. PATENT DOCUMENTS

| | | | |
|---|---|---|---|
| 2016/0281038 | A1 | 9/2016 | Tamai et al. |
| 2021/0005473 | A1 | 1/2021 | Kamimura et al. |

FOREIGN PATENT DOCUMENTS

| | | | | | |
|---|---|---|---|---|---|
| JP | 2009021516 | A | | 1/2009 | |
| JP | 2014093407 | A | | 5/2014 | |
| JP | 2015506583 | A | | 3/2015 | |
| JP | 2015506583 | A1 | | 3/2015 | |
| WO | WO-2007111694 | A2 | * | 10/2007 | ............. C09K 13/08 |
| WO | WO-2015111684 | A1 | | 7/2015 | |
| WO | WO-2016042408 | A2 | * | 3/2016 | ....... H01L 21/02063 |
| WO | WO-2018062053 | A1 | | 4/2018 | |

OTHER PUBLICATIONS

International Search Report issued May 17, 2022 in PCT/JP2022/004347 (with English translation), 4 pages.

Wilson Yeh et al, "Wet Etchant for DRAM Word-line Titanium Nitride Recess with Selectivity to Tungsten", SPCC 2019 Technical Program, [https://www.linx-consulting.com/wpcontent/uploads/2019/04/03-15-W_Yeh-Dupont-Wet_Etchant_for_DRAM_Word_line_TiN_Recess_with_Selectivity_to_W.pdf], Dupont, 2019, 1 page.

* cited by examiner

[Fig.1]
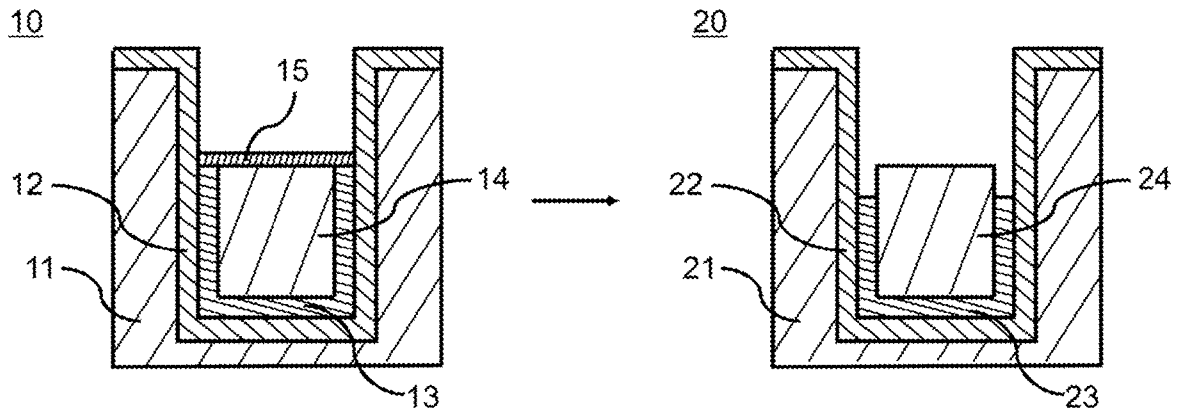
[Fig.2]
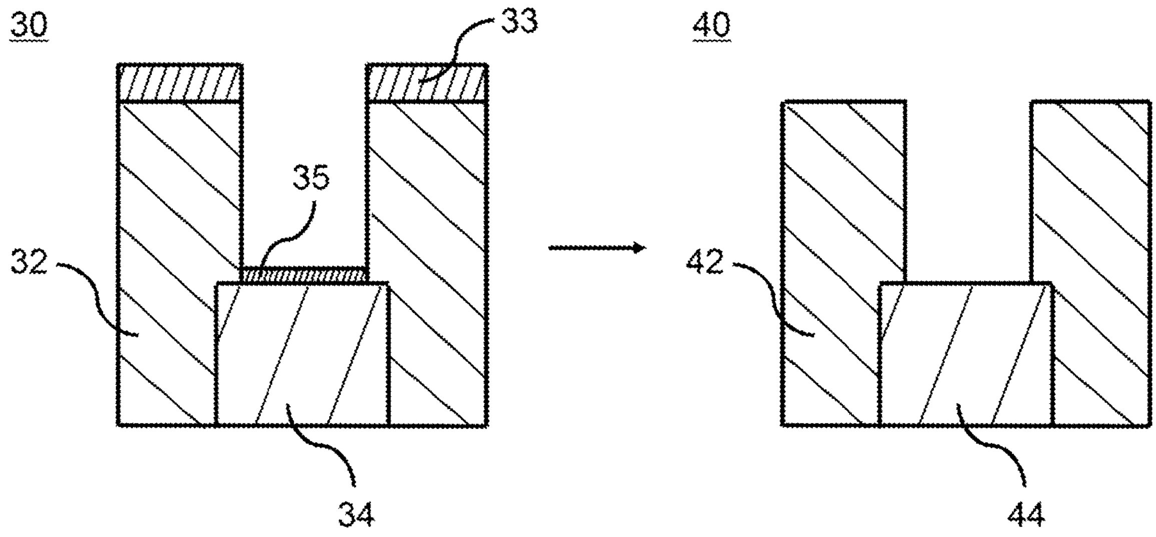

COMPOSITION FOR CLEANING SEMICONDUCTOR SUBSTRATE, METHOD FOR CLEANING SEMICONDUCTOR SUBSTRATE, AND METHOD FOR PRODUCING SEMICONDUCTOR SUBSTRATE

TECHNICAL FIELD

The present invention relates to a composition for cleaning semiconductor substrates, as well as a method for cleaning semiconductor substrates and a method for producing semiconductor substrates.

BACKGROUND ART

In recent years, a further downsizing and advanced features have been required for semiconductor devices, and technologies such as the miniaturization and three-dimensional integration of semiconductor substrates are developing.

For semiconductor substrates capable of such downsizing and advanced features of semiconductor devices, metallic tungsten is suitably used as the material thereof. Metallic tungsten can be deposited by chemical vapor deposition (CVD), and has characteristics such as lower susceptibility to electromigration, low electrical resistance and high heat resistance. For this reason, metallic tungsten is used for embedded word lines or the like in memory elements such as DRAM, and for contact holes or the like in logic elements such as CPU.

It is known that embedded word lines in memory elements can be fabricated by the following method, for example. That is, a barrier film made of silicon oxide, titanium, or titanium nitride and a metallic tungsten film are sequentially deposited on a silicon substrate having a recess formed by etching. Subsequently, the surface thereof is flattened by chemical mechanical polishing (CMP), and further the metallic tungsten film, or the barrier film and the metallic tungsten film are selectively etched by dry etching or the like (CMP may be omitted). Thereafter, the barrier film is selectively etched to fabricate embedded word lines in memory elements (Non Patent Literature 1).

It is also known that via holes in logic elements can be fabricated by damascene process or dual damascene process, for example. Here, the damascene process is illustrated by an example. First of all, a hard mask made of titanium or titanium nitride and a resist film are formed on a multilayer body in which an insulating layer and a silicon substrate having a transistor and a metallic tungsten plug are stacked, and a pattern is formed on the resist film by exposure and development. Subsequently, by using the patterned resist film, a pattern is formed on the hard mask by dry etching (thereafter, the resist may be selectively removed as necessary). Furthermore, the pattern on the hard mask is used as a mask, whereby the insulating film in the multilayer body is etched by dry etching to form via holes for connecting to the metallic tungsten plug. Thereafter, the hard mask is selectively removed by etching, and via holes in logic elements are fabricated.

That is, in any of the cases, there is included a step (selective etching step of titanium and/or a titanium alloy) in which titanium or a titanium alloy such as titanium nitride is selectively removed without causing any damage to metallic tungsten. For this reason, when fabricating small-sized and high-performance semiconductor devices with use of metallic tungsten, there is needed a semiconductor substrate cleaning agent (with high Ti/W etching selectivity) configured to etch titanium or a titanium alloy without etching metallic tungsten.

As such a semiconductor substrate cleaning agent, for example, Patent Literature 1 describes an invention related to a composition for selectively removing titanium nitride and/or photoresist etching residue material from the surface of microelectronic devices having titanium nitride and/or photoresist etching residue material. In this configuration, the composition is characterized by containing at least one oxidizing agent, at least one etching solution, and at least one solvent, and being substantially free of hydrogen peroxide.

CITATION LIST

Patent Literature

Patent Literature 1: JP 2015-506583 A

Non Patent Literature

Non Patent Literature 1: SPCC 2019 Technical Program, "Wet Etchant for DRAM Word-line Titanium Nitride Recess with Selectivity to Tungsten", Wilson et al., [https://www.linx-consulting.com/wp-content/uploads/2019/04/03-15-W_Yeh-Dupont-Wet_Etchant_for_DRAM_Word_line_TiN_Recess_with_Selectivity_to_W.pdf]

SUMMARY OF INVENTION

Technical Problem

However, it has been found that there are cases where a semiconductor element having desired performance cannot be obtained when the composition for cleaning semiconductor substrates described in Patent Literature 1 is used to produce a semiconductor substrate. One of the causes thereof is thought to be an influence of tungsten oxide which is formed by oxidation of the surface of metallic tungsten film in a process of producing semiconductor substrates. For instance, when tungsten oxide is present in a form of covering the surface of titanium nitride in embedded word lines in memory elements, there are cases where the composition for cleaning semiconductor substrates cannot come into contact with titanium nitride and is not able to etch titanium nitride. On the other hand, when tungsten oxide is present on the surface of metallic tungsten in via holes of logic elements, there are cases where the electric resistance of the tungsten plug increases since tungsten oxide has a higher electric resistance than that of metallic tungsten.

The performance and the yield of semiconductor substrates are thought to be improved by selectively removing the tungsten oxide, however, when a tungsten oxide removal step is additionally provided, the manufacturing process will be complicated and manufacturing costs will increase. Therefore, tungsten oxide is preferably removed at the same time in a step of selective etching titanium and/or a titanium alloy. In this case, when the removal rate of tungsten oxide is slow, the amount of time required for the step of selective etching titanium and/or a titanium alloy is increased, and hence the production efficiency (throughput) of semiconductor substrates decreases. Furthermore, in a case where the thickness of tungsten oxide is uneven, a part of the tungsten oxide is rapidly removed, thereby exposing a part of metallic tungsten, and the etching of the exposed metallic tungsten may proceed unintentionally. For this reason, a composition for cleaning semiconductor substrates preferably has a high removal rate of tungsten oxide.

Therefore, the present invention provides a composition for cleaning semiconductor substrates having a high removal rate of tungsten oxide with high Ti/W etching selectivity.

Solution to Problem

As a result of intensive studies with the aim of solving the above-mentioned problem, the present inventors have found that the above-mentioned problem can be solved by adding a tungsten oxide etching accelerator into a composition for cleaning semiconductor substrates, thereby having completed the present invention. That is, the present invention is as follows, for example.

[1] A composition for cleaning semiconductor substrates, comprising an oxidizing agent (A), a fluorine compound (B), a metallic tungsten corrosion inhibiter (C), and a tungsten oxide etching accelerator (D), wherein the addition ratio of the oxidizing agent (A) is from 0.0001 to 10% by mass relative to the total mass of the composition for cleaning semiconductor substrates;

the addition ratio of the fluorine compound (B) is from 0.005 to 10% by mass relative to a total mass of the composition for cleaning semiconductor substrates; and the addition ratio of the metallic tungsten corrosion inhibiter (C) is from 0.0001 to 5% by mass relative to the total mass of the composition for cleaning semiconductor substrates.

[2] The composition for cleaning semiconductor substrates according to the above [1], wherein the addition ratio of the tungsten oxide etching accelerator (D) is from 0.01 to 20% by mass relative to a total mass of the composition for cleaning semiconductor substrates.

[3] The composition for cleaning semiconductor substrates according to the above [1] or [2], wherein the oxidizing agent (A) contains at least one selected from the group consisting of peroxy acids, halogen oxoacids, and salts thereof

[4] The composition for cleaning semiconductor substrates according to any of the above [1] to [3], wherein the fluorine compound (B) contains at least one selected from the group consisting of hydrogen fluoride (HF), tetrafluoroboric acid ($HBF_4$), hexafluorosilicic acid ($H_2SiF_6$), hexafluorozirconic acid ($H_2ZrF_6$), hexafluorotitanic acid ($H_2TiF_6$), hexafluorophosphoric acid ($HPF_6$), hexafluoroaluminic acid ($H_2AlF_6$), hexafluorogermanic acid ($H_2GeF_6$), and salts thereof.

[5] The composition for cleaning semiconductor substrates according to any of the above [1] to [4], wherein the metallic tungsten corrosion inhibiter (C) includes at least one selected from the group consisting of ammonium salts represented by Formula (1) and heteroaryl salts having an alkyl group with 5 to 30 carbon atoms:

(1)

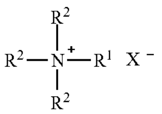

(in Formula (1), $R^1$ represents an alkyl group with 5 to 30 carbon atoms, a substituted or unsubstituted alkyl(poly)heteroalkylene group, a substituted or unsubstituted aryl(poly) heteroalkylene group, or a group represented by Formula (2):

$$*-A-Z-(A)_r-Cy \quad (2)$$

(in Formula (2),

Cy is a substituted or unsubstituted cycloalkyl group with 3 to 10 carbon atoms, a substituted or unsubstituted heterocycloalkyl group with 2 to 10 carbon atoms, a substituted or unsubstituted aryl group with 6 to 15 carbon atoms, or a substituted or unsubstituted heteroaryl group with 2 to 15 carbon atoms, each A is independently an alkylene with 1 to 5 carbon atoms, r is 0 or 1, and Z is any of the following formulae:

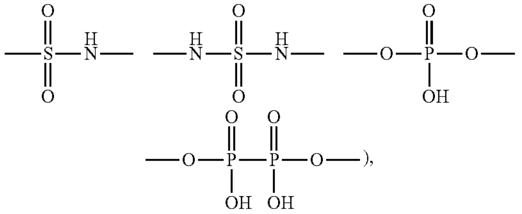

), each $R^2$ independently represents a substituted or unsubstituted alkyl group with 1 to 18 carbon atoms, or a substituted or unsubstituted aryl group with 6 to 20 carbon atoms, and X is a halide ion, a hydroxide ion, an organic sulfonate ion, tetrafluoroborate, or hexafluorophosphate).

[6] The composition for cleaning semiconductor substrates according to any of the above [1] to [5], wherein the tungsten oxide etching accelerator (D) contains at least one selected from the group consisting of hydrogen chloride, hydrogen bromide, hydrogen iodide, sulfuric acid, nitric acid, methanesulfonic acid, trifluoromethanesulfonic acid, benzenesulfonic acid, p-toluenesulfonic acid, 10-camphorsulfonic acid, and salts thereof.

[7] The composition for cleaning semiconductor substrates according to the above [6], wherein the salt is an ammonium salt.

[8] The composition for cleaning semiconductor substrates according to any of the above [1] to [7], having a pH ranging from 0.1 to 5.0.

[9] The composition for cleaning semiconductor substrates according to any of the above [1] to [8], wherein the composition for cleaning semiconductor substrates is for etching tungsten oxide while suppressing etching of metallic tungsten.

[10] A method for cleaning semiconductor substrates, including a step of bringing a semiconductor substrate including a layer containing metallic tungsten, a layer containing at least one of titanium and a titanium alloy, and a layer containing tungsten oxide into contact with the composition for cleaning semiconductor substrates according to any of the above [1] to [9] to remove at least a part of the layer containing at least one of titanium and a titanium alloy and the layer containing tungsten oxide.

[11] A method for producing semiconductor substrates, including a step of bringing a semiconductor substrate including a layer containing metallic tungsten, a layer containing at least one of titanium and a titanium alloy, and a layer containing tungsten oxide into contact with the composition for cleaning semiconductor substrates according to any of the above [1] to [9] to remove at least a part of the layer containing at least one of titanium and a titanium alloy, and the layer containing tungsten oxide.

Advantageous Effects of Invention

According to the present invention, there is provided a composition for cleaning semiconductor substrates having a high removal rate of tungsten oxide with high Ti/W etching selectivity.

BRIEF DESCRIPTION OF DRAWINGS

FIG. 1 is a schematic view of applying the composition for cleaning semiconductor substrates of the present invention to a semiconductor substrate for memory elements.

FIG. 2 is a schematic view when applying the composition for cleaning semiconductor substrates of the present invention to a semiconductor substrate for logic elements.

DESCRIPTION OF EMBODIMENTS

Hereinafter, the embodiments of the present invention will be described in detail.

<Composition for Cleaning Semiconductor Substrates>

The composition for cleaning semiconductor substrates according to the present invention comprises an oxidizing agent (A), a fluorine compound (B), a metallic tungsten corrosion inhibiter (C), and a tungsten oxide etching accelerator (D). In this configuration, the addition ratio of the oxidizing agent (A) is from 0.0001 to 10% by mass relative to the total mass of the composition for cleaning semiconductor substrates; the addition ratio of the fluorine compound (B) is from 0.005 to 10% by mass relative to the total mass of the composition for cleaning semiconductor substrates; and the addition ratio of the metallic tungsten corrosion inhibiter (C) is from 0.0001 to 5% by mass relative to the total mass of the composition for cleaning semiconductor substrates.

The composition for cleaning semiconductor substrates according to the present invention is capable of selectively etching a layer containing at least one of titanium and a titanium alloy included in a semiconductor substrate while suppressing the etching of a layer containing metallic tungsten (W) included in the semiconductor substrate. Specifically, the etching rate of titanium and/or a titanium alloy (Ti) is higher than the etching rate of metallic tungsten (W), and hence the etching selectivity (hereinafter, it may be referred to as "Ti/W etching selectivity") is enhanced.

In this configuration, the titanium alloy is not particularly limited as long as it is obtained by adding one or more metal elements other than titanium or one or more non-metal elements to titanium and has metallic properties, and examples thereof include alloys of titanium with at least one element selected from the group consisting of aluminum, oxygen, nitrogen, carbon, molybdenum, vanadium, niobium, iron, chromium, nickel, tin, hafnium, zirconium, palladium, ruthenium, and platinum. Among them, the titanium alloy is preferably titanium nitride or titanium oxide, and more preferably titanium nitride. Note that, the term "titanium alloy" as used herein means an alloy whose titanium element content is 20% by atomic weight or more relative to the total atomic weight of the titanium alloy. Note that, the content of the titanium element in the titanium alloy is preferably 25% by atomic weight or more, more preferably 30% by atomic weight, still more preferably 35% by atomic weight, and particularly preferably from 40 to 99.9% by atomic weight relative to the total atomic weight of the titanium alloy.

The composition for cleaning semiconductor substrates according to the present invention has a high etching rate of tungsten oxide formed on the surface of a material containing metallic tungsten included in the semiconductor substrate and is capable of suitably removing tungsten oxide. Note that, the term "tungsten oxide" as used herein refers to oxidation products of metallic tungsten, and usually means tungsten(VI) oxide ($WO_3$).

Hereinafter, the present invention will be described with reference to the drawing. Note that the drawing may be illustrated in an exaggerated manner for the sake of explanation, and may be in dimensions different from actual dimensions.

FIG. 1 is a schematic view when applying the composition for cleaning semiconductor substrates of the present invention to a semiconductor substrate for memory elements. The semiconductor substrate for memory elements (before subjected to cleaning) 10 includes: a silicon substrate 11 having a recess; an insulating film 12 made of silicon oxide; a barrier film 13 made of titanium nitride; and a metallic tungsten film 14. Such semiconductor substrate (before subjected to cleaning) 10 can be produced by sequentially depositing an insulating film made of silicon oxide, a barrier film made of titanium nitride, and a metallic tungsten film on a silicon substrate having a recess, followed by planarization by chemical mechanical polishing (CMP), and selective etching of the barrier film and the metallic tungsten film by dry etching or the like (CMP may be omitted). As shown here, the semiconductor substrate for memory elements (before subjected to cleaning) 10 includes tungsten oxide 15, which is formed by oxidation of metallic tungsten, on the barrier film 13 and the metallic tungsten film 14. For this reason, even in an attempt to selectively etch the barrier film 13 made of titanium nitride with use of a composition for cleaning semiconductor substrates, there are cases where the composition for cleaning semiconductor substrates cannot come into contact with the barrier film 13 and is not able to etch the barrier film 13, since tungsten oxide is present in a form of covering the surface of the barrier film 13.

When the composition for cleaning semiconductor substrates of the present invention is applied to the semiconductor substrate for memory elements (before subjected to cleaning) 10 having such a configuration, the tungsten oxide 15 can be suitably removed since the composition for cleaning semiconductor substrates of the present invention has a high etching rate of tungsten oxide. For this reason, the composition for cleaning semiconductor substrates of the present invention can contact with the barrier film 13 made of titanium nitride, and is capable of selectively etching the barrier film owing to its high Ti/W etching selectivity. As a result, there can be produced a semiconductor substrate for memory elements (after subjected to cleaning) 20 in which a silicon substrate 21 having a recess, an insulating film 22 made of silicon oxide, an etched barrier film 23 made of titanium nitride, and a metallic tungsten film 24 are stacked in layers.

FIG. 2 is a schematic view when applying the composition for cleaning semiconductor substrates of the present invention to a semiconductor substrate for logic elements. The semiconductor substrate for logic elements (before subjected to cleaning) 30 is illustrated in a state after having a via hole formed therein. Specifically, the semiconductor substrate for logic elements (before subjected to cleaning) 30 includes: an insulating film 32 made of silicon oxide and formed on a silicon substrate (not illustrated) having a transistor; a patterned hard mask 33 made of titanium nitride and to be disposed on the insulating film 32; and a metallic tungsten plug 34 to be disposed in the insulating film 32. Such a semiconductor substrate for logic elements (before subjected to cleaning) 30 can be produced by the following method. First of all, a hard mask made of titanium nitride and a resist film are formed on a multilayer body in which an insulating layer and a silicon substrate having a transistor and a metallic tungsten plug are stacked, followed by exposure and development to form a pattern on the resist film. Subsequently, by using the patterned resist film, a hard mask pattern is formed by dry etching, and the resist film is removed. Furthermore, by using the hard mask pattern as a mask, the insulating film in the multilayer body is etched by dry etching thereby enabling to produce a semiconductor substrate for logic elements (before subjected to cleaning) 30 having a via hole formed therein. As shown here, the semiconductor substrate for logic elements (before subjected to cleaning) 30 includes tungsten oxide 35, which is formed by oxidation of metallic tungsten, on the metallic tungsten plug 34. When the tungsten oxide 35 is present on the surface of the metallic tungsten plug 34, the electrical resistance of the metallic tungsten plug 34 may increase.

When applying the composition for cleaning semiconductor substrates of the present invention to the semiconductor substrate for logic elements (before subjected to cleaning) 30 having such a configuration, the hard mask 33 made of titanium nitride can be selectively removed since the composition for cleaning semiconductor substrates of the present invention has high Ti/W etching selectivity. In addition, since the composition for cleaning semiconductor substrates of the present invention has a high etching rate of tungsten oxide, the tungsten oxide 35 can be removed as well. As a result, there can be produced a semiconductor substrate for logic elements (after subjected to cleaning) 40 including: an insulating film 42 made of silicon oxide and formed on a silicon substrate (not illustrated) having a transistor; and a metallic tungsten plug 44 disposed in the insulating film 42.

Hereinafter, each component contained in the composition for cleaning semiconductor substrates according to the present invention will be described.

[Oxidizing Agent (A)]

The oxidizing agent (A) has functions such as rendering the oxidation number of titanium atoms in free titanium or in a titanium alloy into the tetravalent state, thereby making them soluble in the composition for cleaning semiconductor substrates.

The oxidizing agent (A) is not particularly limited, and examples thereof include peroxy acids, halogen oxoacids, and salts thereof.

Examples of the peroxy acids include hydrogen peroxide, persulfuric acid, percarbonic acid, perphosphoric acid, peracetic acid, perbenzoic acid, and meta-chloroperbenzoic acid.

Examples of the halogen oxoacids include: oxoacids of chlorine such as hypochlorous acid, chlorous acid, chloric acid, and perchloric acid; oxoacids of bromine such as hypobromous acid, bromous acid, bromic acid, and perbromic acid; and oxoacids of iodine such as hypoiodous acid, iodous acid, iodic acid, and periodic acid.

Examples of the salts include: alkali metal salts such as lithium salts, sodium salts, potassium salts, rubidium salts, and cesium salts of the peroxy acid or of halogen oxoacid; alkaline earth metal salts such as beryllium salts, magnesium salts, calcium salts, strontium salts, and barium salts of the peroxy acid or of the halogen oxoacid; metal salts such as aluminum salts, copper salts, zinc salts, and silver salts of the peroxy acid or of the halogen oxoacid; and ammonium salts of the peroxy acid or of halogen oxoacid.

The above-mentioned oxidizing agent (A) is preferably hydrogen peroxide or an iodine oxoacid, more preferably hydrogen peroxide, iodic acid, or periodic acid, and in view of enhancing the $WO_3$/W etching selectivity and the Ti/W etching selectivity, the oxidizing agent (A) is still more preferably hydrogen peroxide or iodic acid, and particularly preferably iodic acid.

The oxidizing agent (A) mentioned above may be used singly, or two or more kinds thereof may be used in combination. That is, in one embodiment, the oxidizing agent (A) preferably contains at least one selected from the group consisting of peroxy acids, halogen oxoacids, and salts thereof, more preferably contains at least one selected from the group consisting of hydrogen peroxide and iodine oxoacids, still more preferably contains at least one selected from the group consisting of hydrogen peroxide, iodic acid, and periodic acid, particularly preferably contains at least one selected from the group consisting of hydrogen peroxide and iodic acid, and most preferably contains iodic acid.

The addition ratio of the oxidizing agent (A) is from 0.0001 to 10% by mass, preferably from 0.001 to 5% by mass, more preferably from 0.003 to 3% by mass, and still more preferably from 0.01 to 2% by mass relative to the total mass of the composition for cleaning semiconductor substrates. The addition ratio of the oxidizing agent (A) being within the above range is preferable from the perspectives such as enhancing the $WO_3$/W etching selectivity and the Ti/W etching selectivity.

[Fluorine Compound (B)]

The fluorine compound (B) has a function such as facilitating the etching of titanium or a titanium alloy.

The fluorine compound (B) is not particularly limited, and examples thereof include hydrogen fluoride (HF), tetrafluoroboric acid ($HBF_4$), hexafluorosilicic acid ($H_2SiF_6$), hexafluorozirconic acid ($H_2ZrF_6$), hexafluorotitanic acid ($H_2TiF_6$), hexafluorophosphoric acid ($HPF_6$), hexafluoroaluminic acid ($H_2AlF_6$), hexafluorogermanic acid ($H_2GeF_6$), and salts thereof.

In this configuration, examples of the salts include ammonium salts such as ammonium fluoride ($NH_4F$), ammonium tetrafluoroborate ($NH_4BF_4$), ammonium hexafluorosilicate ($(NH_4)_2SiF_6$), and tetramethylammonium tetrafluoroborate ($N(CH_3)_4BF_4$).

Among the above, the fluorine compound (B) is preferably hydrogen fluoride (HF), tetrafluoroboric acid ($HBF_4$), hexafluorosilicic acid ($H_2SiF_6$), or a salt thereof, more preferably hydrogen fluoride (HF), ammonium fluoride ($NH_4F$), or hexafluorosilicic acid ($H_2SiF_6$), and in view of enhancing the $WO_3$/W etching selectivity and the Ti/W etching selectivity, the fluorine compound (B) is still more preferably hydrogen fluoride (HF).

Note that the fluorine compound (B) mentioned above may be used singly, or two or more kinds thereof may be used in combination. That is, in one preferred embodiment, the fluorine compound (B) preferably contains at least one selected from the group consisting of hydrogen fluoride (HF), tetrafluoroboric acid ($HBF_4$), hexafluorosilicic acid ($H_2SiF_6$), hexafluorozirconic acid ($H_2ZrF_6$), hexafluorotitanic acid ($H_2TiF_6$), hexafluorophosphoric acid ($HPF_6$), hexafluoroaluminic acid ($H_2AlF_6$), hexafluorogermanic acid ($H_2GeF_6$), and salts thereof, more preferably contains at least one selected from the group consisting of hydrogen fluoride (HF), tetrafluoroboric acid ($HBF_4$), hexafluorosilicic acid ($H_2SiF_6$), and salts thereof, still more preferably contains at least one selected from the group consisting of hydrogen fluoride (HF), ammonium fluoride ($NH_4F$), and hexafluorosilicic acid ($H_2SiF_6$), and particularly preferably contains hydrogen fluoride (HF).

The addition ratio of the fluorine compound (B) is from 0.005 to 10% by mass, preferably from 0.01 to 5% by mass, more preferably from 0.03 to 3% by mass, and still more preferably from 0.03 to 1% by mass relative to the total mass of the composition for cleaning semiconductor substrates. The addition ratio of the fluorine compound (B) being within the above range is preferable from the perspectives such as improving the etching rate of titanium or titanium alloys, and enhancing the Ti/W etching selectivity.

[Metallic Tungsten Corrosion Inhibiter (C)]

The metallic tungsten corrosion inhibiter (C) is adsorbed to metallic tungsten to form a protective film, thereby having functions such as preventing or suppressing the etching of metallic tungsten with the composition for cleaning semiconductor substrates.

The metallic tungsten corrosion inhibiter (C) is not particularly limited, and examples thereof include: heteroaryl salts having ammonium salts represented by Formula (1); and an alkyl group with 5 to 30 carbon atoms.

(1)

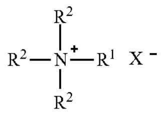

In Formula (1), $R^1$ represents an alkyl group with 5 to 30 carbon atoms, a substituted or unsubstituted alkyl(poly) heteroalkylene group, a substituted or unsubstituted aryl (poly)heteroalkylene group, or a group represented by Formula (2) below.

$$*-A-Z-(A)_r-Cy \quad (2)$$

Here, in Formula (2), Cy represents a substituted or unsubstituted (hetero)cycloalkyl group, or a substituted or unsubstituted (hetero)aryl group, each A independently represents an alkylene with 1 to 5 carbon atoms, r is 0 or 1, and Z is any of the following formulae.

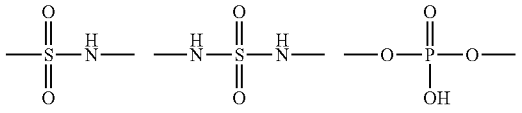

-continued

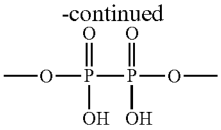

In Formula (2), the mark * represents a bonding position with a nitrogen (N) atom in Formula (1). As a result of this, the corrosion inhibiter is facilitated to adsorb on metallic tungsten and has an enhanced anti-corrosion function for metallic tungsten.

The alkyl group with 5 to 30 carbon atoms is not particularly limited, and examples thereof include pentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, and icosyl group.

The alkyl(poly)heteroalkylene group is represented by $-(C_nH_{2n}-Z-)_m-R^3$. In the formula, each n independently represents an integer from 1 to 5, preferably from 1 to 3, and more preferably from 1 to 2. Each m represents an integer from 1 to 5, preferably from 1 to 2. Each Z is independently an oxygen atom (O), a sulfur atom (S), or a phosphorus atom (P), and is preferably an oxygen atom (O). $R^3$ is an alkyl group with 1 to 30 carbon atoms, and examples thereof include methyl group, ethyl group, propyl group, isopropyl group, butyl group, pentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, and icosyl group.

The alkyl(poly)heteroalkylene group may have a substituent. The said substituent is usually substituted with a hydrogen atom in $R^3$. In the case where the alkyl(poly)heteroalkylene group has a substituent, the substituent is not particularly limited, and examples thereof include: aryl groups with 6 to 20 carbon atoms, such as phenyl group and naphthyl group; alkoxy groups with 1 to 6 carbon atoms, such as methoxy, ethoxy, and propyloxy groups; hydroxy group; cyano group; and nitro group. Note that the alkyl (poly)heteroalkylene group may have one substituent, or may have two or more substituents.

The aryl(poly)heteroalkylene group is represented by $-(C_nH_{2n}-Z-)_m$-Ar. In the formula, each n independently represents an integer from 1 to 5, preferably from 1 to 3, and more preferably from 1 to 2. Each m represents an integer from 1 to 5, preferably from 1 to 2. Each Z is independently an oxygen atom (O), a sulfur atom (S), or a phosphorus atom (P), and is preferably an oxygen atom (0). Ar represents an aryl group with 6 to 18 carbon atoms, and examples thereof include phenyl group, naphthyl group, and anthracenyl group.

The aryl(poly)heteroalkylene group may have a substituent. The said substituent is usually substituted with a hydrogen atom in Ar. In the case where the aryl(poly)heteroalkylene group has a substituent, the substituent is not particularly limited, and examples thereof include: alkyl groups with 1 to 10 carbon atoms, such as methyl group, ethyl group, propyl group, isopropyl group, butyl group, 1,1-dimethylbutyl group, 2,2-dimethylbutyl group, and 1,1,3,3-tetramethylbutyl group; alkoxy groups with 1 to 6 carbon atoms, such as methoxy, ethoxy, and propyloxy groups; hydroxy group; cyano group; and nitro group. Note that the alkyl(poly)heteroalkylene group may have one substituent, or may have two or more substituents.

In Formula (2), Cy is a substituted or unsubstituted cycloalkyl group with 3 to 10 carbon atoms, a substituted or unsubstituted heterocycloalkyl group with 2 to 10 carbon atoms, a substituted or unsubstituted aryl group with 6 to 15 carbon atoms, or a substituted or unsubstituted heteroaryl group with 2 to 15 carbon atoms, and the cycloalkyl group with 3 to 10 carbon atoms is not particularly limited, and examples thereof include cyclopropyl group, cyclobutyl group, cyclopentyl group, and cyclohexyl group. The heterocycloalkyl group with 2 to 10 carbon atoms is not particularly limited, and examples thereof include pyrrolidinyl group, piperidyl group, tetrahydrofuranyl group, tetrahydropyranyl group, and tetrahydrothienyl group. The aryl group with 6 to 15 carbon atoms is not particularly limited, and examples thereof include phenyl group. The heteroaryl group with 2 to 15 carbon atoms is not particularly limited, and examples thereof include pyrrolyl group, imidazolyl group, pyrazolyl group, oxazolyl group, isoxazolyl group, thiazolyl group, isothiazolyl group, pyridyl group, pyrazyl group, pyridazyl group, pyrimidyl group, quinolyl group, and isoquinolyl group.

In the case where the cycloalkyl group with 3 to 10 carbon atoms, the heterocycloalkyl group with 2 to 10 carbon atoms, the aryl group with 6 to 15 carbon atoms, and the heteroaryl group with 2 to 15 carbon atoms each have a substituent, the substituent is not particularly limited, and examples thereof include: alkyl groups with 1 to 10 carbon atoms, such as methyl group, ethyl group, propyl group, isopropyl group, and butyl group; alkoxy groups with 1 to 6 carbon atoms, such as methoxy, ethoxy, and propyloxy groups; alkenyloxy groups such as vinyloxy group, butene-1-enoxy group, and groups represented by $—OC(CF_3)=CF\{(CF_3)_2\}$; aryl groups with 6 to 10 carbon atoms, such as phenyl group and tolyl group; heteroaryl groups with 3 to 10 carbon atoms, such as pyrrolyl group, pyridyl group, imidazolyl group, oxazolyl group, isoxazolyl group, pyrimidyl group, and 4-amino-2-oxo-1,2-dihydropyrimidine-1-yl group; hydroxy group; cyano group; nitro group; and alkoxy groups with 1 to 6 carbon atoms, such as methoxy, ethoxy, and propyloxy groups. Note that the alkyl(poly)heteroalkylene group may have one substituent, or may have two or more substituents.

Each A is independently an alkylene with 1 to 5 carbon atoms. The alkylene with 1 to 5 carbon atoms is not particularly limited, and examples thereof include methylene ($—CH_2—$), ethylene ($—C_2H_4—$), propylene ($—C_3H_6—$), and isopropylene ($—CH(CH_3)CH_2—$).

Moreover, r is 0 or 1.

Furthermore, Z is one of the following formulae.

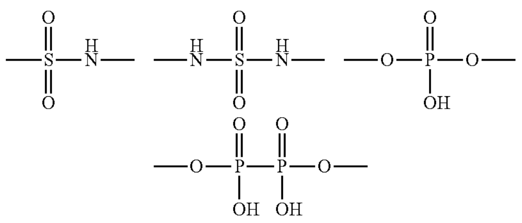

In the formulae, one or two of the hydroxy groups in the structure derived from monophosphoric acid or diphosphoric acid may be in the form of an anion. Specifically, it may have the following structures.

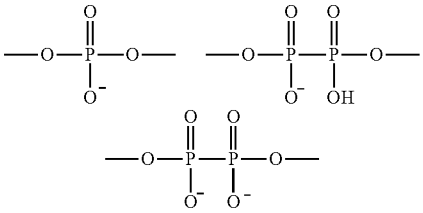

In this case, the counter ion of ammonium cation presents in R', and hence there are cases where ammonium salt $X^-$ is not included in Formula (1).

The group represented by Formula (2) preferably includes the following structures.

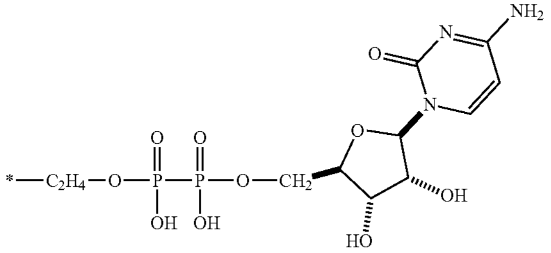

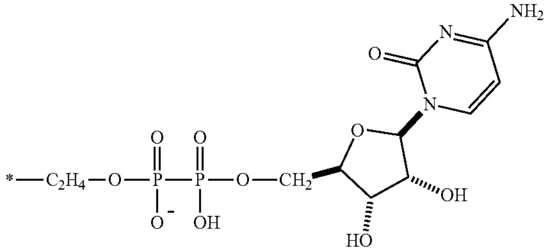

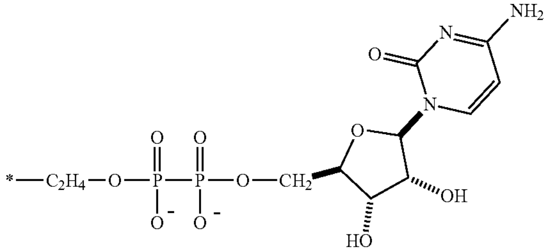

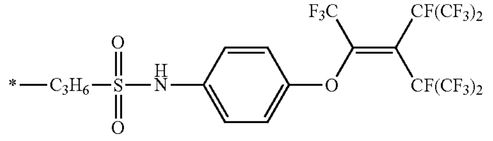

Among them, $R^1$ is preferably an alkyl group with 6 to 20 carbon atoms or a substituted or unsubstituted aryl(poly)oxyalkylene group, more preferably an alkyl group with 8 to 18 carbon atoms or a substituted or unsubstituted phenyl (poly)oxyalkylene group, still more preferably an octyl group, a decyl group, a dodecyl group, a tetradecyl group, a hexadecyl group, an octadecyl group, a phenyloxyethyl ($Ph-O—C_2H_4—$) group, a phenyldi(oxyethylene) ($Ph-(O—C_2H_4)_2—$) group, or a p-(1,1,3,3-tetramethylbutyl)phenyldi (oxyethylene) ($p-CH_3C(CH_3)_2CH_2C(CH_3)_2-Ph-(O—C_2H_4)_2—$) group, particularly preferably a decyl group, a dodecyl group, a tetradecyl group, a hexadecyl group, an octadecyl group, or a p-(1,1,3,3-tetramethylbutyl)phenyldi (oxyethylene) ($p-CH_3C(CH_3)_2CH_2C(CH_3)_2-Ph-(O-C_2H_4)_2-$) group, and most preferably a tetradecyl group, a hexadecyl group, or an octadecyl group.

Each $R^2$ is independently a substituted or unsubstituted alkyl group with 1 to 18 carbon atoms, or a substituted or unsubstituted aryl group with 6 to 20 carbon atoms.

The alkyl group with 1 to 18 carbon atoms is not particularly limited, and examples thereof include methyl group, ethyl group, propyl group, isopropyl group, butyl group, isobutyl group, sec-butyl group, tert-butyl group, pentyl group, hexyl group, heptyl group, octyl group, nonyl group, decyl group, dodecyl group, tetradecyl group, hexadecyl group, and octadecyl group.

In the case where the alkyl group with 1 to 18 carbon atoms has a substituent, examples of the substituent include: aryl groups with 6 to 20 carbon atoms, such as phenyl group and naphthyl group; alkoxy groups with 1 to 6 carbon atoms, such as methoxy, ethoxy, and propyloxy groups; hydroxy group; cyano group; and nitro group.

The aryl group with 6 to 20 carbon atoms is not particularly limited, and examples thereof include phenyl group, naphthyl group, and biphenyl group.

In the case where the aryl group with 6 to 20 carbon atoms has a substituent, examples of the substituent include: alkyl groups with 1 to 10 carbon atoms, such as methyl group, ethyl group, propyl group, and isopropyl group; alkoxy groups with 1 to 6 carbon atoms, such as methoxy, ethoxy, and propyloxy groups; hydroxy group; cyano group; and nitro group.

Among them, $R^2$ is preferably a substituted or unsubstituted alkyl group with 1 to 18 carbon atoms, more preferably a methyl group, an ethyl group, a propyl group, an isopropyl group, a hexyl group, an octyl group, a decyl group, a dodecyl group, a tetradecyl group, a hexadecyl group, an octadecyl group, a benzyl group, a hydroxymethyl group, or a 2-hydroxyethyl group, still more preferably a methyl group, an ethyl group, a benzyl group, or a 2-hydroxyethyl group, particularly preferably a methyl group or a benzyl group, and most preferably a methyl group. In another embodiment, $R^2$ is preferably an alkyl group with 1 to 10 carbon atoms substituted with an aryl group with 6 to 20 carbon atoms, more preferably an alkyl group with 1 to 5 carbon atoms substituted with a phenyl group, still more preferably a benzyl group or a phenylethyl group, and particularly preferably a benzyl group.

The X is a halide ion (fluoride ion, chloride ion, bromide ion, iodide ion, etc.), a hydroxide ion, an organic sulfonate ion (methanesulfonate ion, p-toluenesulfonate ion, etc.), tetrafluoroborate, hexafluorophosphate, or the like. Among them, X is preferably a halide ion, and more preferably a chloride ion or a bromide ion.

Specific examples of the ammonium salt having an alkyl group with 5 to 30 carbon atoms include: ammonium salts having a hexyl group, such as hexyltrimethylammonium bromide; ammonium salts having a heptyl group, such as tetraheptylammonium bromide; ammonium salts having an octyl group, such as octyltrimethylammonium chloride and octyl dimethyl benzyl ammonium chloride; ammonium salts having a decyl group, such as decyltrimethylammonium chloride and decyldimethylbenzylammonium chloride; ammonium salts having a dodecyl group, such as dodecyltrimethylammonium chloride, dodecyltrimethylammonium bromide, dodecylethyldimethylammonium chloride, dodecylethyldimethylammonium bromide, benzyldodecyldimethylammonium chloride, benzyldodecyldimethylammonium bromide, tridodecylmethylammonium chloride, and tridodecylmethylammonium bromide; ammonium salts having a tetradecyl group, such as tetradecyltrimethylammonium bromide and benzyldimethyltetradecylammonium chloride; ammonium salts having a hexadecyl group, such as hexadecyltrimethylammonium chloride, hexadecyltrimethylammonium bromide, hexadecyltrimethylammonium p-toluenesulfonate, hexadecyltrimethylammonium hydroxide, ethylhexadecyldimethylammonium chloride, ethylhexadecyldimethylammonium bromide, and benzyldimethylhexadecylammonium chloride; and ammonium salts having an octadecyl group, such as trimethyloctadecylammonium chloride, trimethyloctadecylammonium bromide, dimethyldioctadecylammonium chloride, dimethyldioctadecylammonium bromide, and benzyldimethyloctadecylammonium chloride.

Specific examples of the ammonium salt having a substituted or unsubstituted alkyl(poly)heteroalkylene group include trimethylpropyldi(oxyethylene)ammonium chloride and trimethylpropyl(oxyethylenethioethylene)ammonium chloride.

Specific examples of the ammonium salts having a substituted or unsubstituted aryl(poly)heteroalkylene group include trimethyl-2-{2-[4-(1,1,3,3-tetramethylbutyl)phenoxy]ethoxy}ethylammonium chloride, benzyldimethyl-2-{2-[4-(1,1,3,3-tetramethylbutyl)phenoxy]ethoxy}ethylammonium chloride (benzetonium chloride), and benzyldimethylphenyldi(oxyethylene)ammonium chloride.

Specific examples of the ammonium salt having a group represented by Formula (2) include compounds represented by the following structures.

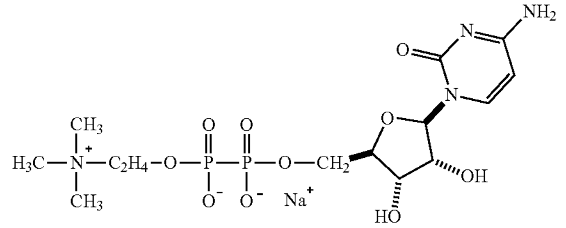

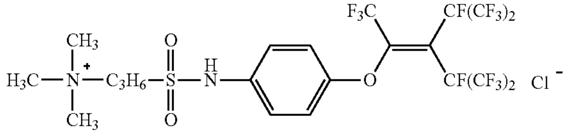

The heteroaryl salt having an alkyl group with 5 to 30 carbon atoms is not particularly limited, and examples thereof include salts of heteroaryl cations in which at least one of nitrogen atoms in a substituted or unsubstituted nitrogen atom-containing heteroaryl ring is bonded to an alkyl group with 5 to 30 carbon atoms.

The nitrogen atom-containing heteroaryl ring is not particularly limited, and examples thereof include rings such as imidazole, pyrazole, oxazole, isoxazole, thiazole, isothiazole, pyridine, pyrazine, pyridazine, pyrimidine, quinoline, and isoquinoline rings.

In the case where the nitrogen atom-containing heteroaryl ring has a substituent, examples of the substituent include: alkyl groups with 1 to 4 carbon atoms, such as methyl group, ethyl group, propyl group, and isopropyl group; aryl groups with 6 to 20 carbon atoms, such as phenyl group and naphthyl group; alkoxy groups with 1 to 6 carbon atoms, such as methoxy, ethoxy, and propyloxy groups; hydroxy group; cyano group; and nitro group.

The alkyl group with 5 to 30 carbon atoms is not particularly limited, and examples thereof include pentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, and icosyl group.

Among them, the alkyl group with 5 to 30 carbon atoms is preferably an alkyl group with 6 to 20 carbon atoms, more preferably an alkyl group with 8 to 18 carbon atoms, still more preferably an octyl group, a decyl group, a dodecyl group, a tetradecyl group, a hexadecyl group, or an octadecyl group, particularly preferably a decyl group, a dodecyl group, a tetradecyl group, a hexadecyl group, or an octadecyl group, and most preferably a tetradecyl group, a hexadecyl group, or an octadecyl group.

The counter anion of the heteroaryl cation having an alkyl group with 5 to 30 carbon atoms is not particularly limited, but example thereof include: halide ions such as fluoride ion, chloride ion, bromide ion, and iodide ion; hydroxide ion; organic sulfonic acid ions such as methanesulfonic acid ion and p-toluenesulfonic acid ion; tetrafluoroborate; and hexafluorophosphate. Among them, the counter anion is preferably a halide ion, and more preferably a chloride ion or a bromide ion.

Specific examples of the heteroaryl salt having an alkyl group with 5 to 30 carbon atoms include: imidazolium salts such as, 1-methyl-3-hexylimidazolium chloride, 1-octyl-3-methylimidazolium chloride, 1-octyl-3-methylimidazolium bromide, 1-octyl-3-methylimidazolium tetrafluoroborate, 1-decyl-3-methylimidazolium chloride, 1-decyl-3-methylimidazolium bromide, 1-decyl-3-methylimidazolium tetrafluorob orate, 1-dodecyl-3-methylimidazolium chloride, 1-dodecyl-3-methylimidazolium bromide, 1-tetradecyl-3-methylimidazolium chloride, 1-tetradecyl-3-methylimidazolium bromide, 1-hexadecyl-3-methylimidazolium chloride, 1-hexadecyl-3-methylimidazolium bromide, 1-octadecyl-3-methylimidazolium chloride and 1-octadecyl-3-methylimidazolium bromide; oxazolium salts such as 3-dodecyl oxazolium chloride, 3-dodecyl oxazolium bromide, 3-tetradecyl oxazolium chloride and 3-hexadecyl oxazolium chloride; thiazolium salts such as 3-dodecylthiazolium chloride, 3-dodecylthiazolium bromide, 3-dodecyl-4-methylthiazolium chloride, 3-tetradecylthiazolium chloride and 3-hexadecylthiazolium chloride; pyridinium salts such as 1-hexylpyridinium chloride, 1-octylpyridinium chloride, 1-decylpyridinium chloride, 1-dodecylpyridinium chloride, 1-dodecylpyridinium bromide, 1-tetradecylpyridinium chloride, 1-tetradecylpyridinium bromide, 1-hexadecylpyridinium chloride, 1-hexadecylpyridinium bromide, 1-octadecylpyridinium chloride, and 1-octadecylpyridinium bromide; pyrimidinium salts such as 1-hexylpyrimidinium chloride, 1-hexylpyrimidinium hexafluorophosphate, 1-octylpyrimidinium chloride, 1-decylpyrimidinium chloride, 1-dodecylpyrimidinium chloride, 1-tetradecylpyrimidinium chloride, and 1-hexadecylpyrimidinium chloride; quinolinium salts such as dodecylquinolinium chloride, dodecylquinolinium bromide, tetradecylquinolinium chloride and hexadecylquinolinium chloride; and isoquinolinium salts such as dodecyl isoquinolinium chloride, dodecyl isoquinolinium bromide, tetradecyl isoquinolinium chloride and hexadecyl isoquinolinium chloride. Furthermore, they may be used as hydrates thereof.

Among these, from the perspective of enhancing the $WO_3$/W etching selectivity, the metallic tungsten corrosion inhibiter (C) is preferably a pyridinium salt having an alkyl group with 5 to 30 carbon atoms, an ammonium salt represented by Formula (1) (wherein $R^1$ is an alkyl group with 6 to 20 carbon atoms, and $R^2$ is a substituted or unsubstituted alkyl group with 1 to 18 carbon atoms), or an ammonium salt having a substituted or unsubstituted aryl (poly)heteroalkylene group, and from the perspective of increasing the etching rate of $WO_3$, more preferably a pyridinium salt having an alkyl group with 14 to 20 carbon atoms, an ammonium salt represented by Formula (1) (wherein $R^1$ is an alkyl group with 14 to 20 carbon atoms, and $R^2$ is a substituted or unsubstituted alkyl group with 1 to 18 carbon atoms), or an ammonium salt having a substituted or unsubstituted phenyl(poly)oxyalkylene group, still more preferably a 1-tetradecylpyridinium salt, a 1-hexadecylpyridinium salt, a 1-octadecylpyridinium salt, a tetradecyltrimethylammonium salt, a hexadecyltrimethylammonium salt, an octadecyltrimethylammonium salt, a tetradecyl dimethyl benzyl ammonium salt, a hexadecyl dimethyl benzyl ammonium salt, an octadecyl dimethyl benzyl ammonium salt, a trimethyl-2-{2-[4-(1,1,3,3-tetramethylbutyl)phenoxy]ethoxy}ethylammonium chloride, or a benzyldimethyl-2-{2-[4-(1,1,3,3-tetramethylbutyl)phenoxy]ethoxy}ethylammonium chloride (benzetonium chloride), and particularly preferably a 1-tetradecylpyridinium salt, a 1-hexadecylpyridinium salt, a 1-octadecylpyridinium salt, a tetradecyltrimethylammonium salt, a hexadecyltrimethylammonium salt, an octadecyltrimethylammonium salt, a tetradecyl dimethyl benzyl ammonium salt, a hexadecyl dimethyl benzyl ammonium salt, or an octadecyl dimethyl benzyl ammonium salt.

Note that, the metallic tungsten corrosion inhibiter (C) mentioned above may be used singly, or two or more kinds thereof may be used in combination. In other words, in one preferred embodiment, from the perspective of enhancing the $WO_3$/W etching selectivity, the metallic tungsten corrosion inhibiter (C) preferably contains at least one selected from the group consisting of pyridinium salts having an alkyl group with 5 to 30 carbon atoms, ammonium salts represented by Formula (1) (wherein $R^1$ is an alkyl group with 6 to 20 carbon atoms, and $R^2$ is a substituted or unsubstituted alkyl group with 1 to 18 carbon atoms), and ammonium salts having a substituted or unsubstituted aryl (poly)heteroalkylene group, and from the perspective of increasing the etching rate of $WO_3$, more preferably contains at least one selected from the group consisting of pyridinium salts having an alkyl group with 14 to 20 carbon atoms, ammonium salts represented by Formula (1) (wherein $R^1$ is an alkyl group with 14 to 20 carbon atoms, and $R^2$ is a substituted or unsubstituted alkyl group with 1 to 18 carbon atoms), and ammonium salts having a substituted or unsubstituted phenyl(poly)oxyalkylene group, still more preferably contains at least one selected from the group consisting of 1-tetradecylpyridinium salt, 1-hexadecylpyridinium salt, 1-octadecylpyridinium salt, tetradecyltrimethylammonium salt, hexadecyltrimethylammonium salt, octadecyltrimethylammonium salt, tetradecyl dimethyl benzyl ammonium salt, hexadecyl dimethyl benzyl ammonium salt, octadecyl dimethyl benzyl ammonium salt, trimethyl-2-{2-[4-(1,1,3,3-tetramethylbutyl)phenoxy]ethoxY}ethylammonium chloride, and benzyldimethyl-2-{2-[4-(1,1,3,3-tetramethylbutyl)phenoxy]ethoxy}ethylammonium chloride (benzetonium chloride), and further preferably contains at least one selected from the group consisting of a 1-tetradecylpyridinium salt, 1-hexadecylpyridinium salt, 1-octadecylpyridinium salt, tetradecyltrimethylammonium salt, hexadecyltrimethylammonium salt, octadecyltrimethylammonium salt, tetradecyl dimethyl benzyl ammonium salt, hexadecyl dimethyl benzyl ammonium salt, and octadecyl dimethyl benzyl ammonium salt.

The addition ratio of the metallic tungsten corrosion inhibiter (C) is from 0.0001 to 5% by mass, preferably from 0.001 to 1% by mass, more preferably from 0.003 to 0.5% by mass, and still more preferably from 0.004 to 0.08% by mass relative to the total mass of the composition for cleaning semiconductor substrates. The addition ratio of the metallic tungsten corrosion inhibiter (C) being within the above range is preferable from the perspectives such as being able to reduce the etching rate of tungsten.

[Tungsten Oxide Etching Accelerator (D)]

The tungsten oxide etching accelerator (D) has a function of accelerating etching of tungsten oxide.

The tungsten oxide etching accelerator (D) is not particularly limited, and examples thereof include hydrogen chloride, hydrogen bromide, hydrogen iodide, sulfuric acid, nitric acid, methanesulfonic acid, trifluoromethanesulfonic acid, benzenesulfonic acid, p-toluenesulfonic acid, 10-camphorsulfonic acid, and salts thereof.

In this configuration, examples of the salt include: ammonium salts such as ammonium chloride, ammonium bromide, ammonium iodide, ammonium sulfate, and ammonium nitrate; alkylammonium salts such as methylamine hydrochloride, dimethylamine hydrochloride, dimethylamine hydrobromide, and methylamine sulfate. Among them, the salt is preferably an ammonium salt.

Among the above, the tungsten oxide etching accelerator (D) is preferably hydrogen chloride, hydrogen bromide, hydrogen iodide, sulfuric acid, nitric acid, trifluoromethanesulfonic acid, benzenesulfonic acid, p-toluenesulfonic acid, or a salt thereof, more preferably hydrogen chloride, hydrogen bromide, hydrogen iodide, sulfuric acid, nitric acid, trifluoromethanesulfonic acid, benzenesulfonic acid, p-toluenesulfonic acid, or an ammonium salt thereof, further preferably hydrogen chloride, hydrogen bromide, hydrogen iodide, sulfuric acid, nitric acid, ammonium sulfate, ammonium nitride, methanesulfonic acid, trifluoromethanesulfonic acid, benzenesulfonic acid, or p-toluenesulfonic acid, and from the perspective of being able to retain a high Ti/W etching selectivity, particularly preferably hydrogen chloride, hydrogen bromide, hydrogen iodide, sulfuric acid, nitric acid, methanesulfonic acid, trifluoromethanesulfonic acid, benzenesulfonic acid, or p-toluenesulfonic acid, still more preferably hydrogen chloride, hydrogen bromide, hydrogen iodide, sulfuric acid, nitric acid, or methanesulfonic acid, and most preferably sulfuric acid or nitric acid.

The tungsten oxide etching accelerator (D) described above may be used singly, or two or more kinds thereof may be used in combination. In other words, in one preferred embodiment, the tungsten oxide etching accelerator (D) preferably contains at least one selected from the group consisting of hydrogen chloride, hydrogen bromide, hydrogen iodide, sulfuric acid, nitric acid, methanesulfonic acid, trifluoromethanesulfonic acid, benzenesulfonic acid, p-toluenesulfonic acid, 10-camphorsulfonic acid, and salts thereof, more preferably contains at least one selected from the group consisting of hydrogen chloride, hydrogen bromide, hydrogen iodide, sulfuric acid, nitric acid, ammonium chloride, ammonium bromide, ammonium iodide, ammonium sulfate, ammonium nitrate, methanesulfonic acid, trifluoromethanesulfonic acid, benzenesulfonic acid, p-toluenesulfonic acid, and 10-camphorsulfonic acid, still more preferably contains at least one selected from hydrogen chloride, hydrogen bromide, hydrogen iodide, sulfuric acid, nitric acid, methanesulfonic acid, trifluoromethanesulfonic acid, benzenesulfonic acid, and p-toluenesulfonic acid, particularly preferably contains at least one selected from hydrogen chloride, hydrogen bromide, hydrogen iodide, sulfuric acid, and nitric acid, and most preferably contains at least one of sulfuric acid and nitric acid.

The addition ratio of the tungsten oxide etching accelerator (D) is preferably from 0.01 to 20% by mass, more preferably from 0.03 to 10% by mass, still more preferably from 0.05 to 8% by mass, particularly preferably from 0.1 to 3% by mass, and most preferably from 0.1 to 0.8% by mass relative to the total mass of the composition for cleaning semiconductor substrates. The addition ratio of the tungsten oxide etching accelerator (D) being within the above range is preferable since the removal rate of tungsten oxide can be enhanced while retaining a high Ti/W etching selectivity.

[pH Adjusting Agent]

The composition for cleaning semiconductor substrates optionally contains a pH adjusting agent. As the pH adjusting agent, for example, there can be used an alkali or an acid with the exception of the oxidizing agent (A), the fluorine compound (B), and the tungsten oxide etching accelerator (D). As the acid, an organic acid or an inorganic acid can be used. As the alkali, an organic alkali or an inorganic alkali can be used. The pH adjusting agent is preferably ammonia.

[Solvent]

The composition for cleaning semiconductor substrates preferably contains a solvent. The solvent has functions such as uniformly dispersing and diluting each component contained in the composition for cleaning semiconductor substrates.

Examples of the solvent include water and organic solvents.

The water mentioned above is not particularly limited, but is preferably water from which metal ions, organic impurities, particles and grains, and the like have been removed by distillation, ion exchange process, filtering process, various adsorption processes, or the like, more preferably pure water, and particularly preferably ultrapure water.

The organic solvent is not particularly limited, but examples thereof include: alcohols such as methanol, ethanol, 1-propanol, 2-propanol, 1-butanol, and tert-butanol; polyhydric alcohols such as ethylene glycol, propylene glycol, neopentyl glycol, 1,2-hexanediol, 1,6-hexanediol, 2-ethylhexane-1,3-diol, and glycerin; glycol ethers such as diethylene glycol monomethyl ether, diethylene glycol monoethyl ether, diethylene glycol monobutyl ether, propylene glycol monomethyl ether, propylene glycol monoethyl ether, dipropylene glycol monomethyl ether, tripropylene glycol monomethyl ether, dipropylene glycol dimethyl ether, dipropylene glycol monoethyl ether, propylene glycol n-propyl ether, dipropylene glycol n-propyl ether, tripropylene glycol n-propyl ether, propylene glycol n-butyl ether, dipropylene glycol n-butyl ether, tripropylene glycol n-butyl ether, and propylene glycol phenyl ether.

Among the above, the solvent is more preferably water. Note that, the solvent may be used singly, or two or more kinds thereof may be used in combination.

The addition ratio of the solvent, especially of water, is preferably 50% by mass or more, more preferably 80% by mass or more, still more preferably 90% by mass or more, and particularly preferably 95% by mass or more, relative to the total mass of the composition for cleaning semiconductor substrates. The addition ratio of the solvent being 50% by mass or more is preferable from the perspectives such as being able to suitably control the Ti/W etching selectivity and the $WO_3$/W etching selectivity.

[Iodine Scavenger]

When the oxidizing agent (A) contains an iodine oxoacid, the composition for cleaning semiconductor substrates preferably further contains an iodine scavenger.

The iodine scavenger is not particularly limited, but examples thereof include: aliphatic ketones such as acetone, butanone, 2-methyl-2-butanone, 3,3-dimethyl-2-butanone, 4-hydroxy-2-butanone, 2-pentanone, 3-pentanone, 3-methyl-2-pentanone, 4-methyl-2-pentanone, 2-methyl-3-pentanone, 5-methyl-3-pentanone, 2,4-dimethyl-3-pentanone, 5-hydroxy-2-pentanone, 4-hydroxy-4-methyl-2-pentanone, 2-hexanone, 3-hexanone, 2-heptanone, 3-heptanone, 4-heptanone, 5-methyl-2-heptanone, 5-methyl-3-heptanone, 2,6-dimethyl-4-heptanone, 2-octanone, 3-octanone, 4-octanone, cyclohexanone, 2,6-dimethylcyclohexanone, 2-acetylcyclohexanone, menthone, cyclopentanone, and dicyclohexyl ketone; aliphatic diketones such as 2,5-hexanedione, 2,4-pentanedione, and acetylacetone; and aromatic ketones such as acetophenone, 1-phenylethanone, and benzophenone. Among them, the iodine scavenger is preferably an aliphatic ketone, more preferably 4-methyl-2-pentanone, 5-methyl-3-pentanone, 2,4-dimethyl-3-pentanone, or cyclohexanone, and still more preferably 4-methyl-2-pentanone. Note that, the iodine scavenger may be used singly, or two or more kinds thereof may be used in combination.

[Low Dielectric Constant Passivation Agent]

The composition for cleaning semiconductor substrates may further contain a low dielectric constant passivation agent. The low dielectric constant passivation agent has a function to prevent or suppress the etching of a low dielectric constant film (e.g., an insulating film).

The low dielectric constant passivation agent is not particularly limited, but examples thereof include: boric acid; borates such as ammonium pentaborate and sodium tetraborate; and carboxylic acids such as 3-hydroxy-2-naphthoic acid, malonic acid, and iminodiacetic acid.

The low dielectric constant passivation agent may be used singly, or two or more kinds thereof may be used in combination.

The addition ratio of the low dielectric constant passivation agent is preferably from 0.01 to 2% by mass, more preferably from 0.02 to 1% by mass, and still more preferably from 0.03 to 0.5% by mass relative to the total mass of the composition for cleaning semiconductor substrates.

[Additive]

The composition for cleaning semiconductor substrates may further contain an additive. Examples of the additive include surfactants, chelating agents, antifoaming agents, and silicon-containing compounds.

[Physical Properties of Composition for Cleaning Semiconductor Substrates]

The composition for cleaning semiconductor substrates preferably has a pH ranging from 0.1 to 5.0, and from the perspective of enhancing the Ti/W etching selectivity, more preferably from 0.1 to 3, still more preferably from 0.2 to 2, even more preferably from 0.3 to 1.8, and particularly preferably from 0.4 to 1.5.

The etching rate of tungsten oxide with the composition for cleaning semiconductor substrates is preferably 2.0 Å/min or more, more preferably 2.2 Å/min or more, still more preferably 2.5 Å/min or more, particularly preferably from 3.0 to 50 Å/min, and most preferably from 3.5 to 30 Å/min. The etching rate of tungsten oxide being 2.0 Å/min or more is preferable from the perspectives such as being able to reduce the time required for the step of selective etching titanium and/or a titanium alloy, and enhancing the $WO_3$/W etching selectivity. Note that the etching rate of tungsten oxide means a value measured by the method used in Examples.

The etching rate of metallic tungsten with the composition for cleaning semiconductor substrates is preferably 7.5 Å/min or less, more preferably 5.0 Å/min or less, still more preferably 4.5 Å/min or less, particularly preferably 4.0 Å/min or less, and most preferably from 0.1 to 3.5 Å/min. The etching rate of metallic tungsten being 7.5 Å/min or less is preferable since the Ti/W etching selectivity is enhanced. Note that, the etching rate of metallic tungsten means a value measured by the method used in Examples.

The etching rate of titanium or titanium alloys with the composition for cleaning semiconductor substrates is preferably 7 Å/min or more, more preferably 9 Å/min or more, still more preferably 15 Å/min or more, further more preferably 30 Å/min or more, particularly preferably 50 Å/min or more, and most preferably 80 Å/min or more. The etching rate of titanium alloys being 7 Å/min or more is preferable since the Ti/W etching selectivity is enhanced. Note that the etching rate of titanium or titanium alloys means a value measured by the method used in Examples.

The etching rate of the insulating layer material with the composition for cleaning semiconductor substrates is preferably 3.0 Å/min or less, more preferably 1.0 Å/min or less, still more preferably 0.7 Å/min or less, particularly preferably 0.6 Å/min or less, and most preferably 0.5 Å/min or less. The etching rate of the insulating layer material being 3.0 Å/min or less is preferable since the semiconductor substrate retains its shape and has an enhanced performance as a semiconductor element. Note that, the insulating layer material is not particularly limited, and examples thereof include silicon oxide (e.g., th-Ox). Note that, the etching rate of the insulating layer material means a value measured by the method used in Examples.

The Ti/W etching selectivity (the etching rate of titanium or titanium alloys divided by the etching rate of metallic tungsten) with the composition for cleaning semiconductor substrates is preferably 5 or more, more preferably 10 or more, still more preferably 20 or more, particularly preferably 30 or more, and most preferably 50 or more. The Ti/W etching selectivity being 5 or more is preferable since a desired etching manufacturing process can be constructed.

The $WO_3$/W etching selectivity (the etching rate of tungsten oxide divided by the etching rate of metallic tungsten) with the composition for cleaning semiconductor substrates is preferably 0.5 or more, more preferably 0.8 or more, still more preferably 1.0 or more, particularly preferably from 1.5 to 15, and most preferably from 3 to 10. The $WO_3$/W etching selectivity being 0.5 or more is preferable since the productivity is increased. That is, according to one preferred embodiment, there is provided a composition for cleaning semiconductor substrates, which is configured for etching tungsten oxide while suppressing etching of metallic tungsten.

<Method for Cleaning Semiconductor Substrates>

According to one embodiment of the present invention, there is provided a method for cleaning semiconductor substrates with use of the above-described composition for cleaning semiconductor substrates. The method for cleaning semiconductor substrates includes: a step of bringing a semiconductor substrate including a layer containing metallic tungsten, a layer containing at least one of titanium and a titanium alloy, and a layer containing tungsten oxide into contact with the above-described composition for cleaning semiconductor substrates to remove at least a part of the layer containing at least one of titanium and a titanium alloy and at least a part of the layer containing tungsten oxide.

The semiconductor substrate before subjected to cleaning may have different configuration in accordance with its application. For example, in a case where a semiconductor substrate is used for memory elements, the semiconductor substrate may have a multilayer structure in which an insulating film, a barrier film made of titanium or titanium nitride, and a metallic tungsten film are stacked in this order on a silicon substrate having a recess. In this configuration, the surface of the metallic tungsten film may include a tungsten oxide film generated by oxidation of metallic tungsten. The tungsten oxide film is generated by, for example, oxidation by oxygen in the atmosphere, oxidation by ashing, or the like. In such an embodiment, the layer containing metallic tungsten corresponds to the metallic tungsten film, the layer containing at least one of titanium and a titanium alloy corresponds to the barrier film, and the layer containing tungsten oxide corresponds to the tungsten oxide film.

Otherwise, in a case where a semiconductor substrate is used for logic elements, the semiconductor substrate may include an etched insulating film, a patterned hard mask made of titanium or titanium nitride, and metallic tungsten formed at the bottom of a recess formed by etching in the insulating film, on a silicon substrate having a transistor layer. In this configuration, the semiconductor substrate may include a tungsten oxide film, which is generated by oxidation of metallic tungsten, on the surface of the metallic tungsten. The tungsten oxide film is generated by, for example, oxidation by oxygen in the atmosphere, oxidation by ashing, or the like. In the case of such an embodiment, the layer containing metallic tungsten corresponds to metallic tungsten formed at the bottom of a recess formed by etching in the insulating film, the layer containing at least one of titanium and a titanium alloy corresponds to the hard mask, and the layer containing tungsten oxide corresponds to the tungsten oxide film.

Apart from this, the configuration of the semiconductor substrate before subjected to cleaning can be changed by appropriately referring to a known technique.

By bringing the semiconductor substrate before subjected to cleaning into contact with the above-described composition for cleaning semiconductor substrates, at least a part of the layer containing at least one of titanium and a titanium alloy and at least a part of the layer containing tungsten oxide can be removed. As a result of this, tungsten oxide can be removed while selectively etching titanium and/or a titanium alloy.

The method of bringing the semiconductor substrate into contact with the composition for cleaning semiconductor substrates is not particularly limited, and a known technique can be appropriately adopted. Specifically, the semiconductor substrate may be immersed in the composition for cleaning semiconductor substrates, the composition for cleaning semiconductor substrates may be sprayed onto the semiconductor substrate, or the composition for cleaning semiconductor substrates may be dropped onto the semiconductor substrate (single wafer spin processing etc.). In this occasion, the immersion may be repeated two or more times, the spraying may be repeated two or more times, the dropping may be repeated two or more times, or the immersion, the spraying, and the dropping may be combined.

The contact temperature is not particularly limited, but is preferably from 0 to 90 °C, more preferably from 15 to 80 °C, and still more preferably from 20 to 70 °C.

The contact time is not particularly limited, but is preferably from 10 seconds to 3 hours, more preferably from 10 seconds to 1 hour, still more preferably from 10 seconds to 45 minutes, and particularly preferably from 20 seconds to 5 minutes.

<Method for Producing Semiconductor Substrates>

Furthermore, according to one embodiment of the present invention, there is provided a method for producing semiconductor substrates with the above-described composition for cleaning semiconductor substrates. The method for producing semiconductor substrates includes a step of bringing a semiconductor substrate including a layer containing metallic tungsten, a layer containing at least one of titanium and a titanium alloy, and a layer containing tungsten oxide into contact with the above-described composition for cleaning semiconductor substrates to remove at least a part of the layer containing at least one of titanium and a titanium alloy and at least a part of the layer containing tungsten oxide.

A specific method of the step mentioned above is the same as the above-mentioned method of cleaning semiconductor substrates.

The semiconductor substrate thus produced can be used for a material of semiconductor devices thereby enabling to produce semiconductor devices having high performance.

EXAMPLES

Hereinafter, the present invention will be specifically described with reference to Examples, but the present invention is not limited thereto.

Example 1

Iodic acid ($HIO_3$) as an oxidizing agent (A), hydrogen fluoride (HF) as a fluorine compound (B), 1-dodecylpyridinium chloride (DPC) as a metallic tungsten corrosion inhibiter (C), and sulfuric acid as a tungsten oxide etching accelerator (D) were added to pure water, and the mixture was stirred to produce a composition for cleaning semiconductor substrates. In this occasion, the addition ratios of iodic acid, hydrogen fluoride, 1-dodecylpyridinium chloride (DPC), and sulfuric acid were 0.018% by mass, 0.05% by mass, 0.005% by mass, and 0.5% by mass, respectively, relative to the total mass of the composition for cleaning semiconductor substrates. Note that the composition for cleaning semiconductor substrates had a pH of 1.3. The pH of the pretreatment agent was measured at 23 °C with a tabletop pH meter (F-71) and a pH electrode (9615S-10D) manufactured by HORIBA, Ltd.

Examples 2 to 19 and Comparative Examples 1 to 8

As shown in Tables 1 and 2 below, the components to be added and the like were changed to produce the composition for cleaning semiconductor substrates.

TABLE 1

| | Oxidizing agent (A) | | Fluorine compound (B) | | Metallic tungsten corrosion inhibiter (C) | |
|---|---|---|---|---|---|---|
| | Type | Addition ratio (% by mass) | Type*[1] | Addition ratio (% by mass) | Type*[2] | Addition ratio (% by mass) |
| Example 1 | Iodic acid | 0.018 | HF | 0.05 | DPC | 0.005 |
| Example 2 | Hydrogen peroxide | 0.500 | HF | 0.05 | DPC | 0.005 |
| Example 3 | Periodic acid | 0.058 | HF | 0.05 | DPC | 0.005 |
| Example 4 | Iodic acid | 0.002 | HF | 0.05 | DPC | 0.005 |
| Example 5 | Iodic acid | 0.018 | $NH_4F$ | 0.1 | DPC | 0.005 |
| Example 6 | Iodic acid | 0.018 | $H_2[SiF_6]$ | 0.5 | DPC | 0.005 |
| Example 7 | Iodic acid | 0.018 | HF | 0.05 | CPC | 0.001 |
| Example 8 | Iodic acid | 0.018 | HF | 0.05 | DMIC | 0.005 |
| Example 9 | Iodic acid | 0.018 | HF | 0.05 | CTAB | 0.005 |
| Example 10 | Iodic acid | 0.018 | HF | 0.05 | HTMAB | 0.1 |
| Example 11 | Iodic acid | 0.018 | HF | 0.05 | BZC | 0.001 |
| Example 12 | Iodic acid | 0.018 | HF | 0.05 | DPC | 0.005 |
| Example 13 | Iodic acid | 0.018 | HF | 0.05 | DPC | 0.005 |
| Example 14 | Iodic acid | 0.018 | HF | 0.05 | DPC | 0.005 |
| Example 15 | Iodic acid | 0.018 | HF | 0.05 | DPC | 0.005 |
| Example 16 | Iodic acid | 0.018 | HF | 0.05 | DPC | 0.005 |
| Example 17 | Iodic acid | 0.018 | HF | 0.05 | DPC | 0.05 |
| Example 18 | Iodic acid | 0.018 | HF | 0.05 | DPC | 0.005 |
| Example 19 | Iodic acid | 0.018 | HF | 0.05 | DPC | 0.005 |

| | Tungsten oxide etching accelerator (D) | | pH adjusting agent | | |
|---|---|---|---|---|---|
| | Type | Addition ratio (% by mass) | Type | Addition ratio (% by mass) | Composition pH |
| Example 1 | Sulfuric acid | 0.5 | — | 0 | 1.3 |
| Example 2 | Sulfuric acid | 0.5 | — | 0 | 1.2 |
| Example 3 | Sulfuric acid | 0.5 | — | 0 | 1.2 |
| Example 4 | Sulfuric acid | 0.5 | — | 0 | 1.3 |
| Example 5 | Sulfuric acid | 0.5 | — | 0 | 1.4 |
| Example 6 | Sulfuric acid | 0.5 | — | 0 | 1.0 |
| Example 7 | Sulfuric acid | 0.5 | — | 0 | 1.2 |
| Example 8 | Sulfuric acid | 0.5 | — | 0 | 1.2 |
| Example 9 | Sulfuric acid | 0.5 | — | 0 | 1.2 |
| Example 10 | Sulfuric acid | 0.5 | — | 0 | 1.2 |
| Example 11 | Sulfuric acid | 0.5 | — | 0 | 1.2 |
| Example 12 | Hydrogen chloride | 0.5 | — | 0 | 1.1 |
| Example 13 | Nitric acid | 0.5 | — | 0 | 1.4 |
| Example 14 | Ammonium sulfate | 0.5 | — | 0 | 2.6 |
| Example 15 | Methanesulfonic acid | 1 | — | 0 | 1.1 |
| Example 16 | Sulfuric acid | 1 | — | 0 | 1.1 |
| Example 17 | Sulfuric acid | 5 | — | 0 | 0.4 |
| Example 18 | Sulfuric acid | 0.1 | — | 0 | 1.8 |
| Example 19 | Sulfuric acid | 0.5 | Ammonia | 0.15 | 2.2 |

*[1]HF: Hydrogen fluoride, $NH_4F$: Ammonium fluoride, $H_2[SiF_6]$: Hexafluorosilicic acid

*[2]DPC: 1-Dodecyl pyridinium chloride, CPC: Hexadecylpyridinium chloride monohydrate, DMIC: 1-Dodecyl-3-methylimidazolium chloride, CTAB: Hexadecyltrimethylammonium bromide, HTMAB: Hexyltrimethylammonium bromide, BZC: Benzalkonium chloride

TABLE 2

| | Oxidizing agent (A) | | Fluorine compound (B) | | Metallic tungsten corrosion inhibiter (C) | |
|---|---|---|---|---|---|---|
| | Type | Concentration | Type | Concentration | Type*[1] | Concentration |
| Comparative Example 1 | Iodic acid | 0.018 | HF | 0.05 | DPC | 0.005 |
| Comparative Example 2 | Iodic acid | 0.018 | HF | 0.05 | DPC | 0.005 |
| Comparative Example 3 | Iodic acid | 0.018 | HF | 0.05 | DPC | 0.005 |
| Comparative Example 4 | Iodic acid | 0.018 | HF | 0.05 | DPC | 0.005 |
| Comparative Example 5 | Iodic acid | 0.018 | HF | 0.05 | DPC | 0.005 |
| Comparative Example 6 | Periodic acid | 0.003 | $H_2[SiF_6]$ | 1.2 | BZC | 0.004 |

TABLE 2-continued

| | | | | | | |
|---|---|---|---|---|---|---|
| Comparative Example 7 | Iodic acid | 0.018 | HF | 0.05 | — | 0 |
| Comparative Example 8 | Iodic acid | 0.018 | HF | 0.05 | — | 0 |

| | Tungsten oxide etching accelerator (D) | | pH adjusting agent | | Composition |
|---|---|---|---|---|---|
| | Type | Concentration | Type*2 | Concentration | pH |
| Comparative Example 1 | — | 0 | — | 0 | 2.4 |
| Comparative Example 2 | Phosphoric acid | 0.33 | — | 0 | 1.8 |
| Comparative Example 3 | Acetic acid | 0.61 | — | 0 | 2.3 |
| Comparative Example 4 | Ammonia | 0.03 | — | 0 | 3.1 |
| Comparative Example 5 | Phosphoric acid | 4.56 | — | 0 | 1.2 |
| Comparative Example 6 | — | 0 | TEOS | 0.3 | |
| Comparative Example 7 | — | 0 | — | 0 | 2.3 |
| Comparative Example 8 | Sulfuric acid | 0.5 | — | 0 | 1.2 |

*1DPC: 1-Dodecyl pyridinium chloride, BZC: Benzalkonium chloride
*2TEOS: Tetraethoxysilane Note that DPC, CPC, DMIC, CTAB, HTMAB, and BZC used in Examples and Comparative Examples have the following structures.

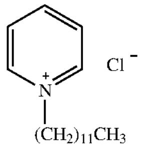
DPC

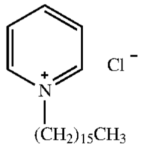
CPC $H_2O$

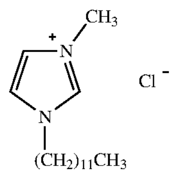
DMIC

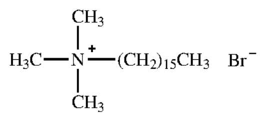
CTAB

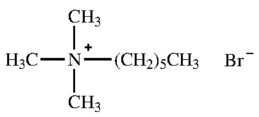
HTMAB

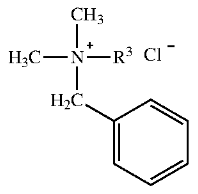
$R^3$= $-C_8H_{17}$ ~ $C_{18}H_{37}$

BZC

[Evaluation]

The compositions for cleaning semiconductor substrates produced in Examples 1 to 19 and Comparative Examples 1 to 8 were evaluated in terms of: the etching rates of the tungsten oxide film, of the metallic tungsten film, of the titanium nitride film, and of the silicon oxide (th-Ox) film; the etching selectivity of tungsten oxide ($WO_3$) over metallic tungsten (W) ($WO_3$/W etching selectivity); and the etching selectivity of titanium nitride (TiN) over metallic tungsten (W) (TiN/W etching selectivity).

(Etching Rate of Tungsten Oxide ($WO_3$) Film)

Tungsten oxide ($WO_3$) was deposited on a silicon wafer by physical vapor deposition until the tungsten oxide film formed thereon had a thickness of 3000 Å, and the wafer was cut into a size of 1 cm×1 cm (immersion treatment area: 1 $cm^2$) to prepare tungsten oxide film deposited samples.

The tungsten oxide film deposited samples each were immersed in 10 g of the composition for cleaning semiconductor substrates produced in each of Examples 1 to 19 and Comparative Examples 1 to 8 at a predetermined treatment temperature for 10 minutes. The composition for cleaning semiconductor substrates after the immersion treatment was diluted 10 to 20 times with a 1% by mass aqueous solution of nitric acid to prepare a measurement sample. The tungsten concentration in the measurement sample was determined with the ICP Optical Emission Spectrometer (ICP-OES): Avio 200 (manufactured by PerkinElmer).

In this occasion, samples for creating calibration curve were prepared by the following method. That is, a tungsten standard solution (tungsten concentration: 1000 ppm, manufactured by FUJIFILM Wako Pure Chemical Corporation) was diluted with a 1% by mass aqueous solution of nitric acid to prepare samples for creating calibration curves having tungsten concentrations of 25 ppb, 12.5 ppb, and 2.5 ppb.

The tungsten concentration of the measurement sample was calculated by using the samples for creating calibration curve, the tungsten concentration before dilution was calculated from the tungsten concentration of the measurement sample, and the tungsten concentration before dilution and the amount of the composition for cleaning semiconductor substrates used (the amount of the measurement sample before dilution) were put into the following equation to calculate the etching amount of the tungsten oxide film.

$$\text{Etching amount of } WO_3(\text{Å}) = \frac{\text{W concentration before dilution (ppb)} \times 100 \times \text{Amount of composition used (mL)} \times 231.84\ (\text{g/mol})}{1000 \times 7.16\ (\text{g/cm}^3) \times 1\ (\text{cm}^2) \times 183.84\ (\text{g/mol})}$$

Note that, in the equation above, 231.84 (g/mol) is the molecular weight of tungsten oxide ($WO_3$), 7.16 ($g/cm^3$) is the density of tungsten oxide, 1 $cm^2$ is the immersion treatment area of the tungsten oxide film deposited sample, and 183.84 (g/mol) is the molecular weight of metallic tungsten (W).

The calculated etching amount of the tungsten oxide film was divided by the time duration of immersion treatment with the composition for cleaning semiconductor substrates to calculate the etching rate (E.R.) of the tungsten oxide film. The obtained results are shown in Table 3 below.

(Etching Rate of Metallic Tungsten (W) Film)

Tungsten (W) was deposited on a silicon wafer by physical vapor deposition until the tungsten film formed thereon had a thickness of 1000 Å, and the wafer was cut into a size of 1 cm×1 cm (immersion treatment area: 1 $cm^2$) to prepare metallic tungsten film deposited samples.

With the exception that the metallic tungsten film deposited sample was used and that the immersion treatment time was 2 minutes, a measurement sample was prepared in the same manner as in the method for measuring the etching rate of the tungsten oxide film, and the tungsten concentration in the measurement sample was measured.

The tungsten concentration of the measurement sample was calculated by using the samples for creating calibration curve, the tungsten concentration before dilution was calculated from the tungsten concentration of the measurement sample, and the tungsten concentration before dilution and the amount of the composition for cleaning semiconductor substrates used for the measurement (the amount of the measurement sample before dilution) were put into the following equation to calculate the etching amount of the metallic tungsten film.

$$\text{Etching amount of W (Å)} = \frac{\text{W concentration before dilution (ppb)} \times 100 \times \text{Amount of composition used (mL)}}{1000 \times 19.25\ (g/cm^3) \times 1\ (cm^2)}$$

Note that, in the equation above, 19.25 ($g/cm^3$) is the density of metallic tungsten, and 1 $cm^2$ is the immersion treatment area of the tungsten film deposited sample.

The calculated etching amount of the metallic tungsten film was divided by the time duration of immersion treatment with the composition for cleaning semiconductor substrates to calculate the etching rate (E.R.) of the metallic tungsten film. The obtained results are shown in Table 3 below.

(Etching Rate of Titanium Nitride (TiN) Film)

Titanium nitride (TiN) was deposited on a silicon wafer by physical vapor deposition until the titanium nitride film formed thereupon had a thickness of 1000 Å, and the wafer was then cut into a size of 2 cm×2 cm (immersion treatment area: 4 cm') to prepare titanium nitride film deposited samples.

The film thickness of the titanium nitride film deposited sample was determined with the X-ray fluorescence analyzer EA-1200VX (manufactured by Hitachi High-Tech Corporation).

The titanium nitride film deposited sample was immersed in 10 g of the composition for cleaning semiconductor substrates produced in each of Examples 1 to 19 and Comparative Examples 1 to 8 at a predetermined treatment temperature for a predetermined time.

The film thickness of the titanium nitride film deposited sample after the immersion treatment with the composition for cleaning semiconductor substrates was measured by the same method as described above.

The difference in the film thickness of the titanium nitride film deposited sample between before and after the immersion treatment with the composition for cleaning semiconductor substrates was calculated, and was divided by the time duration of immersion treatment with the composition for cleaning semiconductor substrates to calculate the etching rate (E.R.) of the titanium nitride film. The obtained results are shown in Table 3 below.

(Etching Rate of Silicon Oxide (Th-Ox) Film)

Silicon wafer was thermally oxidized until the silicon oxide film formed thereon had a thickness of 1000 Å, and the wafer was then cut into a size of 1 cm×1 cm (immersion treatment area: 1 $cm^2$) to prepare silicon oxide film formed samples.

The film thickness of the silicon oxide film formed sample was determined with the optical coating thickness gauge n&k1280 (manufactured by n&k Technology Inc.).

The silicon oxide film formed sample was immersed in 10 g of the composition for cleaning semiconductor substrates produced in each of Examples 1 to 19 and Comparative Examples 1 to 8 at a predetermined treatment temperature for 30 minutes.

The film thickness of the silicon oxide film formed sample after the immersion treatment was measured by the same method as described above.

The difference in the film thickness of the silicon oxide film formed sample between before and after the treatment was calculated, and was divided by the time duration of immersion treatment with the composition for cleaning semiconductor substrates, thereby calculating the etching rate (E.R.) of the silicon oxide film. The obtained results are shown in Table 3 below.

[$WO_3$/W Etching Selectivity]

The etching rate (E.R.) of the tungsten oxide film was divided by the etching rate (E.R.) of the metallic tungsten film to calculate the $WO_3$/W etching selectivity with the composition for cleaning semiconductor substrates produced in each of Examples 1 to 19 and Comparative Examples 1 to 8. The obtained results are shown in Table 3 below.

[TiN/W Etching Selectivity]

The etching rate (E.R.) of the titanium nitride film was divided by the etching rate (E.R.) of the metallic tungsten film to calculate the TiN/W etching selectivity with the composition for cleaning semiconductor substrates produced in each of Examples 1 to 19 and Comparative Examples 1 to 8. The obtained results are shown in Table 3 below.

TABLE 3

| | Treatment temperature | Immersion time of TiN | E.R. (Å/min) | | | | Etching selectivity | |
|---|---|---|---|---|---|---|---|---|
| | (° C.) | film (min) | $WO_3$ | W | TiN | th-Ox | $WO_3$/W | TiN/W |
| Example 1 | 40 | 5 | 2.6 | 0.8 | 89 | 0.5 | 3.2 | 111 |
| Example 2 | 40 | 5 | 2.5 | 1.0 | 47 | 0.3 | 2.4 | 45 |
| Example 3 | 40 | 5 | 2.3 | 2.4 | 78 | 0.3 | 1.0 | 32 |
| Example 4 | 40 | 5 | 2.1 | 2.4 | 181 | 0.2 | 0.9 | 77 |
| Example 5 | 40 | 5 | 3.5 | 3.5 | 142 | 0.2 | 1.0 | 40 |
| Example 6 | 40 | 5 | 3.4 | 3.0 | 21 | <0.1 | 1.1 | 7 |
| Example 7 | 40 | 5 | 4.1 | 0.6 | 7 | 0.3 | 6.8 | 12 |
| Example 8 | 40 | 5 | 2.6 | 4.4 | 56 | <0.1 | 0.6 | 13 |
| Example 9 | 40 | 10 | 3.9 | 1.2 | 9 | 0.4 | 3.3 | 8 |
| Example 10 | 40 | 5 | 3.4 | 0.5 | 63 | 0.7 | 6.8 | 126 |
| Example 11 | 40 | 5 | 6.1 | 1.5 | 63 | 0.2 | 4.1 | 41 |
| Example 12 | 40 | 5 | 3.3 | 3.8 | 103 | 0.6 | 0.9 | 27 |
| Example 13 | 40 | 5 | 2.0 | 1.9 | 119 | 0.8 | 1.1 | 64 |
| Example 14 | 40 | 5 | 14.1 | 5.0 | 41 | 1.0 | 2.8 | 8 |
| Example 15 | 40 | 5 | 3.2 | 3.4 | 92 | 0.2 | 0.9 | 27 |
| Example 16 | 40 | 5 | 3.5 | 1.5 | 33 | 0.4 | 2.3 | 22 |
| Example 17 | 50 | 10 | 2.5 | 0.6 | 17 | <0.1 | 3.9 | 26 |
| Example 18 | 50 | 5 | 3.5 | 2.8 | 203 | 0.6 | 1.3 | 73 |
| Example 19 | 40 | 5 | 28.7 | 3.8 | 134 | 1.1 | 7.6 | 36 |
| Comparative Example 1 | 40 | 5 | 1.2 | 2.1 | 87 | — | — | 41 |
| Comparative Example 2 | 40 | — | 1.1 | — | — | — | — | — |
| Comparative Example 3 | 40 | — | 0.8 | — | — | — | — | — |
| Comparative Example 4 | 40 | — | 1.0 | — | — | — | — | — |
| Comparative Example 5 | 40 | 10 | 1.9 | 1.7 | 1 | — | — | 0.6 |
| Comparative Example 6 | 50 | — | 1.0 | 0.2 | — | — | — | — |
| Comparative Example 7 | 40 | 5 | — | 85.0 | 112 | — | — | 1.3 |
| Comparative Example 8 | 40 | 5 | 127.8 | 131.9 | 72 | — | — | 0.5 |

It can be seen from the results in Table 3 that the composition for cleaning semiconductor substrates in each of Examples 1 to 19 has a high TiN/W etching selectivity. In addition, it can be seen that the composition for cleaning semiconductor substrates in each of Examples 1 to 19 has a high etching rate of tungsten oxide ($WO_3$), and hence the processing time for removing tungsten oxide can be shortened.

REFERENCE SIGNS LIST

10 Semiconductor substrate for memory elements (before subjected to cleaning)
11 Silicon substrate with a recess
12 Insulating film
13 Barrier film
14 Metallic tungsten film
15 Tungsten oxide
20 Semiconductor substrate for memory elements (after subjected to cleaning)
21 Silicon substrate with a recess
22 Insulating film
23 Etched barrier film
24 Metallic tungsten film
30 Semiconductor substrate for logic elements (before subjected to cleaning)
32 Insulating film
33 Hard mask
34 Metallic tungsten plug
35 Tungsten oxide
40 Semiconductor substrate for logic elements (after subjected to cleaning)
42 Insulating film
44 Metallic tungsten plug

The invention claimed is:

1. A composition for cleaning semiconductor substrates, comprising an oxidizing agent (A), a fluorine compound (B), a metallic tungsten corrosion inhibiter (C), and a tungsten oxide etching accelerator (D), wherein the oxidizing agent (A) comprises iodic acid;

wherein the fluorine compound (B) comprises hydrogen fluoride (HF);

wherein the metallic tungsten corrosion inhibiter (C) comprises at least one selected from the group consisting of ammonium salts represented by Formula (1) and a pyridinium salt having an octyl group, a decyl group, or a dodecyl group:

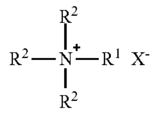

(1)

wherein in Formula (1), $R^1$ represents a pentyl group or hexyl group, each $R^2$ independently represents a methyl group, ethyl group, propyl group, or isopropyl group, X is a halide ion, a hydroxide ion, an organic sulfonate ion, tetrafluoroborate, or hexafluorophosphate;

wherein the tungsten oxide etching accelerator (D) comprises sulfuric acid;

wherein an addition ratio of the oxidizing agent (A) is from 0.0001 to 10% by mass relative to a total mass of the composition for cleaning semiconductor substrates;

an addition ratio of the fluorine compound (B) is from 0.005 to 10% by mass relative to a total mass of the composition for cleaning semiconductor substrates;

an addition ratio of the metallic tungsten corrosion inhibiter (C) is from 0.0001 to 5% by mass relative to a total mass of the composition for cleaning semiconductor substrates; and wherein the composition for cleaning semiconductor substrates has a pH ranging from 1.2 to 1.8.

2. The composition for cleaning semiconductor substrates according to claim 1, wherein an addition ratio of the tungsten oxide etching accelerator (D) is from 0.01 to 20% by mass relative to a total mass of the composition for cleaning semiconductor substrates.

3. The composition for cleaning semiconductor substrates according to claim 1, wherein the composition for cleaning semiconductor substrates is formulated for etching tungsten oxide while suppressing etching of metallic tungsten.

4. A method for cleaning semiconductor substrates, the method comprising bringing a semiconductor substrate comprising a layer containing metallic tungsten, a layer comprising at least one of titanium and a titanium alloy, and a layer containing tungsten oxide into contact with the composition for cleaning semiconductor substrates according to claim 1 to remove at least a part of the layer comprising at least one of titanium and a titanium alloy and at least a part of the layer comprising tungsten oxide.

5. A method for producing semiconductor substrates, the method comprising bringing a semiconductor substrate comprising a layer containing metallic tungsten, a layer comprising at least one of titanium and a titanium alloy, and a layer containing tungsten oxide into contact with the composition for cleaning semiconductor substrates according to claim 1 to remove at least a part of the layer comprising at least one of titanium and a titanium alloy, and the layer comprising tungsten oxide.

* * * * *